United States Patent
Elizondo et al.

(10) Patent No.: US 12,037,889 B2
(45) Date of Patent: Jul. 16, 2024

(54) PERMANENT ELECTROMAGNET SENSOR TO DETECT THE END OF REVERSE CEMENTING

(71) Applicant: Halliburton Energy Services, Inc., Houston, TX (US)

(72) Inventors: Hector Jesus Elizondo, Houston, TX (US); Ritesh Dharmendra Panchal, Houston, TX (US); Jinhua Cao, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 47 days.

(21) Appl. No.: 17/988,881

(22) Filed: Nov. 17, 2022

(65) Prior Publication Data

US 2024/0167376 A1    May 23, 2024

(51) Int. Cl.
| | |
|---|---|
| *E21B 47/017* | (2012.01) |
| *E21B 47/092* | (2012.01) |
| *G01R 33/07* | (2006.01) |
| *E21B 21/00* | (2006.01) |

(52) U.S. Cl.
CPC .......... *E21B 47/017* (2020.05); *E21B 47/092* (2020.05); *G01R 33/07* (2013.01); *E21B 21/00* (2013.01)

(58) Field of Classification Search
CPC ...... E21B 47/017; E21B 47/092; E21B 37/00; E21B 21/00; G01R 33/07
See application file for complete search history.

(56) References Cited

U.S. PATENT DOCUMENTS

| | | | | |
|---|---|---|---|---|
| 5,698,773 | A | * | 12/1997 | Blom .................. G01N 11/162 73/32 A |
| 2003/0029611 | A1 | * | 2/2003 | Owens .................... E21B 33/14 166/250.03 |
| 2003/0192695 | A1 | * | 10/2003 | Dillenbeck ............. E21B 33/05 166/285 |
| 2010/0000728 | A1 | | 1/2010 | O'Keefe et al. |
| 2012/0227483 | A1 | | 9/2012 | Kruspe et al. |
| 2014/0290351 | A1 | | 10/2014 | Kruspe |
| 2015/0021034 | A1 | | 1/2015 | Kruspe |
| 2016/0258280 | A1 | | 9/2016 | Murphree et al. |
| 2021/0131197 | A1 | * | 5/2021 | Panayirci ............ E21B 17/1078 |
| 2022/0065818 | A1 | | 3/2022 | Werkheiser et al. |

OTHER PUBLICATIONS

"PCT Application No. PCT/US2022/080191, International Search Report and Written Opinion", Aug. 2, 2023, 10 pages.

* cited by examiner

*Primary Examiner* — D. Andrews
(74) *Attorney, Agent, or Firm* — DeLizio, Peacock, Lewin & Guerra, LLP

(57) ABSTRACT

In some embodiments, a method for reducing magnetic debris accumulation on a downhole sensor within a tubular conveyed in a borehole comprises supplying a voltage to temporarily neutralize a magnetic field of a permanent electromagnet proximate to the downhole sensor and removing magnetic debris on the downhole sensor via a flow of a first fluid in the tubular while the magnetic field is neutralized.

20 Claims, 7 Drawing Sheets

PERMANENT ELECTROMAGNET SENSOR TO DETECT THE END OF REVERSE CEMENTING

TECHNICAL FIELD

The disclosure generally relates to the field of equipment utilized and operations performed in cementing a subterranean well and, more specifically, magnetic sensing downhole tools used during a cementing operation.

BACKGROUND

Reverse circulation cementing (hereinafter "reverse cementing") involves displacing fluids between the outside of a casing and a formation wall in a subterranean well operation. A sensor coupled with a permanent electromagnet on the inner or outer diameter of the casing at or near the bottom of the wellbore may detect when the cementing fluids reach the bottom of the wellbore and begin entering the inside of the casing through a flow port. In response, a signal may be sent downhole to close a valve or sleeve to prevent cementing fluids from ascending the inside of the casing. One such cementing fluid, such as a spacer fluid, may consist of a slurry used to clean the wellbore of drilling fluids/mud prior to cementing the well. The slurry may comprise magnetic particles detectable by the sensor. Accumulation of magnetic particles on the sensor may inhibit its function, which could lead to a failure to halt cement intrusion inside the casing. Therefore, dynamic control of the permanent electromagnet's magnetic field may assist in clearing the sensor of magnetic debris.

BRIEF DESCRIPTION OF THE DRAWINGS

Embodiments of the disclosure may be better understood by referencing the accompanying drawings.

DESCRIPTION OF EMBODIMENTS

The description that follows includes example systems, methods, techniques, and program flows that embody embodiments of the disclosure. However, it is understood that this disclosure may be practiced without these specific details. For instance, this disclosure refers to reducing magnetic particle accumulation on a permanent electromagnet sensor plug assembly during a reverse cementing operation in illustrative examples. Embodiments of this disclosure may be instead applied to magnetic sensor cleaning during other subterranean wellbore operations including traditional cementing operations. In other instances, well-known instruction instances, protocols, structures, and techniques have not been shown in detail in order not to obfuscate the description.

Overview

A Hall effect sensor assembly ("downhole sensor") that may withstand hostile subterranean environments and a computing device are disclosed herein for modulating a timing sequence of a permanent electromagnet during reverse cementing operations. At designated stages of reverse cementing operations, a material with high magnetic permeability is added to a slurry to be sent downhole to enable the downhole sensor to detect the magnetic permeability or Hall effect of the slurry. The downhole sensor may be situated downhole near a flow port to detect the presence of a slurry with known magnetic permeability corresponding to the slurry sent downhole. The downhole may be coupled to a magnet source (e.g., a permanent electromagnet) and the computing device. Magnetic material within the slurry may accumulate on the downhole sensor over time as the particles are attracted to the magnet source. Over time, this may inhibit the sensor's ability to make accurate readings. Thus, the computing device may be configured to apply a voltage from a power source to the magnet source at certain time intervals, which may temporarily neutralize a magnetic field generated by the magnet source. When the magnetic field is neutralized, the slurry may wash away accumulated particulates, and the downhole sensor may return to normal function until the process is repeated.

Example Illustrations

Figure 1:
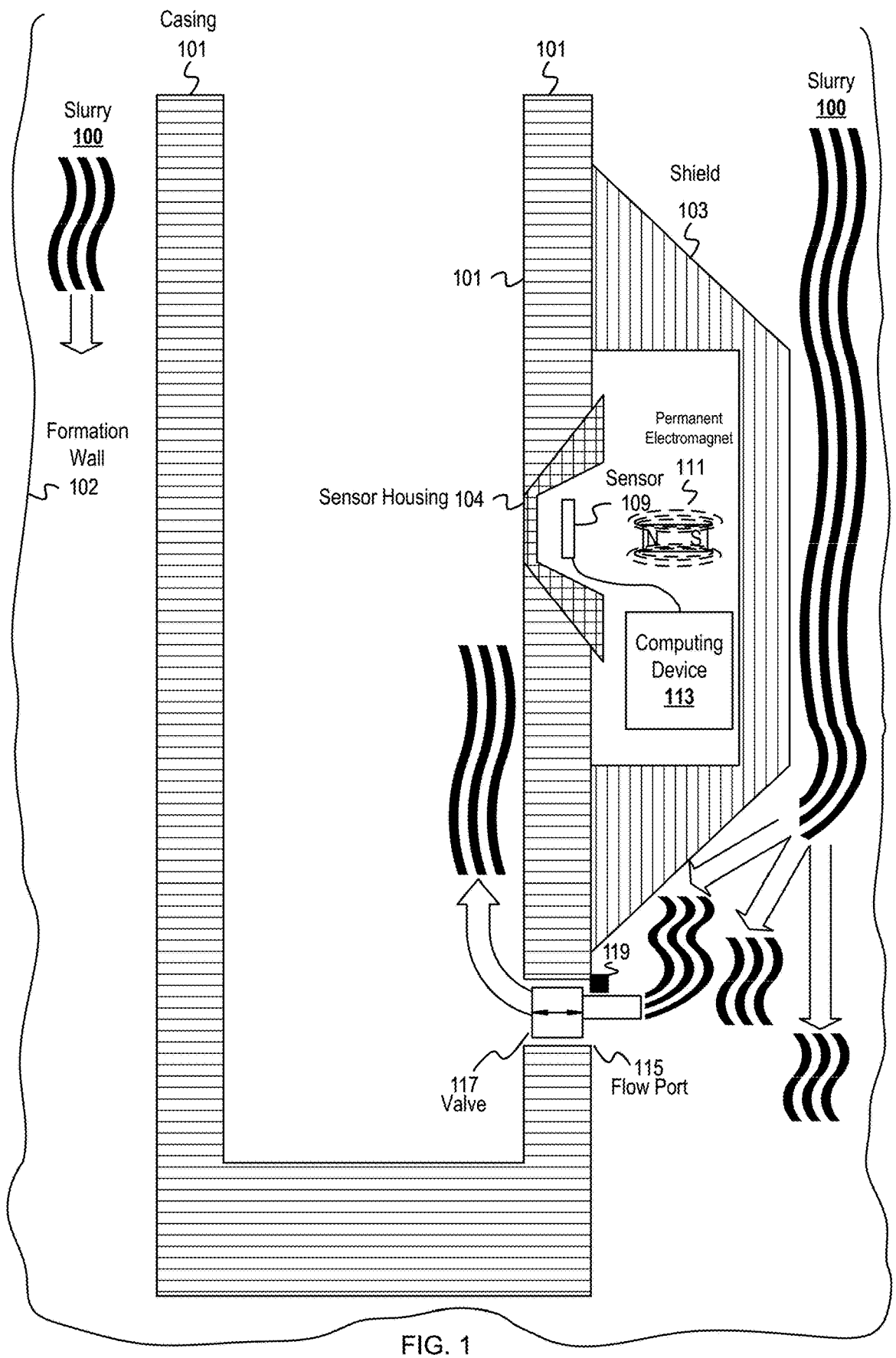
FIG. 1 depicts a cross-section of an exemplary reverse cementing operation with a downhole sensor comprising a permanent electromagnet, according to some embodiments.

FIG. 1 is a cross-section of an exemplary reverse cementing operation with a downhole sensor comprising a permanent electromagnet, according to some embodiments. During reverse cementing operations, a slurry 100 of cementing fluids may flow outside an oilfield tubular 101, adjacent to a formation wall 102, and into a flow port 115 after which it is detected by a downhole sensor 109. The downhole sensor 109 may include a magnetic sensor. The downhole sensor 109 may be coupled with a permanent electromagnet 111 and a computing device 113. The downhole sensor 109 also may be coupled with a sensor housing 104. The downhole sensor 109 also may be couple with a shield 103 that protects the downhole sensor 109 from the slurry 100 on the outside of the oilfield tubular 101. In some embodiments, the downhole sensor 109 may be situated between the permanent electromagnet 111 and the sensor housing 104. In alternate embodiments, the downhole sensor 109 may be placed anywhere along a flow path of the slurry 100.

The permanent electromagnet 111 may be positioned within the sensor housing 104 to induce a magnetic field outside of the sensor housing 104 into the interior of the oilfield tubular 101. The sensor housing 104 may be positioned near the flow port 115 so that the presence of the slurry 100 may be detected as the slurry 100 enters the interior of the oilfield tubular 101. In some embodiments, the sensor housing 104 may comprise non-ferromagnetic material. The downhole sensor 109 pictured in FIG. 1 may be integrated into the oilfield tubular 101 prior to deployment downhole and may be powered upon deployment of the oilfield tubular 101 to preserve battery power.

The sensor housing 104 may comprise any low-cost non-ferromagnetic material (i.e., material having low magnetic permeability) that may allow the passage of the magnetic field of the permanent electromagnet 111 into the slurry 100. For instance, the non-ferromagnetic material may comprise steel, titanium, aluminum, any alloys thereof such as INCONEL® alloy 718, plastics, composites, ceramics, glass, etc. The sensor housing 104 and shield 103 may comprise any low-cost material that may protect the downhole sensor 109 under operational conditions (e.g., carbon steel, steel alloys, et cetera). The downhole sensor 109 may comprise a Hall effect sensor and associated components. In some embodiments, the downhole sensor 109 may include any sensor that detects the strength of a magnetic field or magnetic flux such as a giant magnetoresistance (GMR) sensor, a microelectromechanical magnetic field sensor, magnetic force sensor, etc.

The measurements taken by the downhole sensor 109 may increase in strength as the magnetic permeability of the slurry 100 increases due to increased concentrations of a high magnetic permeability material in the slurry 100. The slurry 100 may comprise a spacer fluid or similar detection slurry having a plurality of particles with a high magnetic permeability such as suspended iron particles, martensitic stainless-steel particles, ferritic particles, iron oxide particles, ferrofluid particles, or other particles with a high magnetic permeability in a fluid. In some embodiments, as the magnetic permeability of the slurry 100 increases, the magnetic flux detected by the downhole sensor 109 may also increase.

Figure 2:
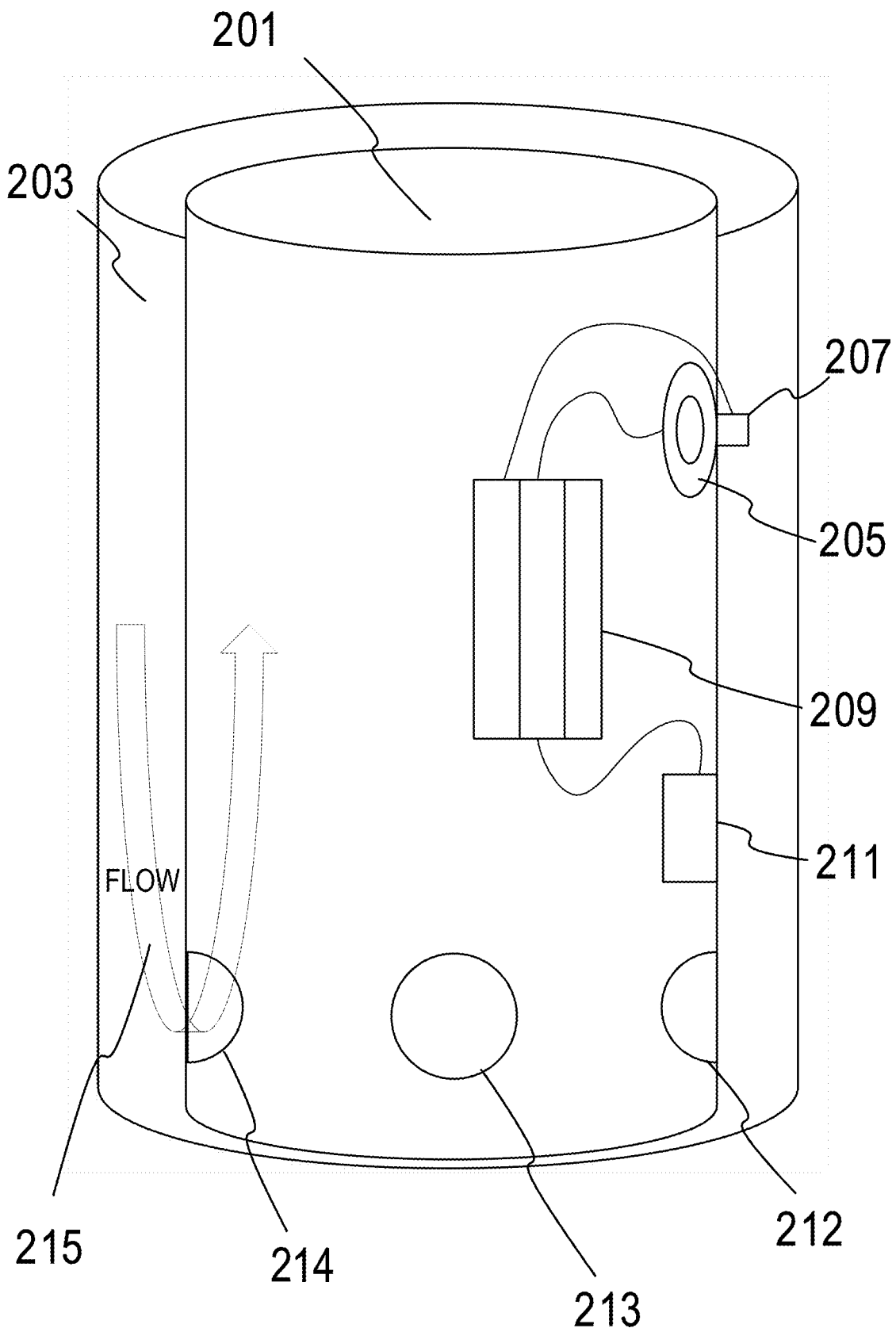
FIG. 2 depicts a schematic diagram of a system component arrangement in the borehole, according to some embodiments.

FIG. 2 is a schematic diagram of a system component arrangement in the borehole, according to some embodiments. FIG. 2 depicts a work string 201 during a reverse cementing operation, where a slurry 215 may travel down an annulus 203 and enter the work string 201 through flow ports 212-214 (similar to those in FIG. 1). A Hall effect sensor assembly 205 may be situated proximate to a permanent electromagnet 207. The Hall effect sensor assembly 205 may comprise a Hall effect sensor, a plug to contact the slurry 215, and a printed circuit board (PCB) which may be coupled with various components. The permanent electromagnet 207 and Hall effect sensor assembly 205 may be further coupled with an acquisition and measurement system 209. The acquisition and measurement system 209 may function similarly to the computing device 113 of FIG. 1. In some embodiments, the acquisition and measurement system 209 may be configured to receive measurements from the Hall effect sensor assembly 205 and, based on the measurements, actuate an actuator 211. The acquisition and measurement system 209 may comprise a controller board that, in some embodiments, may control various timing sequences (explained with further detail in the description of FIG. 6) and, in some embodiments, a timing of measurements taken by the Hall effect sensor within the Hall effect sensor assembly 205. The actuator 211 may be coupled with a flow sleeve (not shown) that may be actuated to close the flow ports 212-214 at an end of the reverse cementing operation. Timing this closure correctly may depend upon accurate readings from the Hall effect sensor assembly 205—closing the sleeve too early or too late may negatively impact the reverse cementing operation. Thus, ensuring the sensor remains accurate and free of magnetic debris throughout the operation may be advantageous.

In some embodiments, the Hall effect sensor assembly 205 may accumulate magnetic debris as magnetic particles are attracted to and deposit on or proximate to the permanent electromagnet 207. The permanent electromagnet 207 may include a permanent magnet and core that may generate a permanent magnetic field around the permanent electromagnet 207 and the adjacent Hall effect sensor assembly 205. Over time, the accumulation of magnetic particles may inhibit the Hall effect sensor assembly's ability to accurately measure the Hall effect within the slurry 215. Therefore, the acquisition and measurement system 209 may include a timing sequence where, at certain time intervals, the permanent electromagnet may be supplied power to dynamically control the magnetic field around the Hall effect sensor assembly 205. When a voltage is applied to a coil surrounding the permanent magnet (explained further in FIG. 3), the magnetic field generated by the permanent magnet may be neutralized. At each time interval when the magnetic field is neutralized, the slurry 215 may remove and wash away debris from the Hall effect sensor assembly 205. In some embodiments, the Hall effect sensor assembly 205 may be depicted as facing towards the inside of the work string 201; however, the Hall effect sensor assembly 205 may alternatively face the outside of the work string 201 to detect the slurry 215 before it enters the interior of the work string 201.

In some embodiments, the slurry 215 may comprise a cementing fluid such as a cement slurry, a spacer, a brine, a mud, or any fluid used during the cementing process (e.g., to cement the outside of the work string 201 or to clean cuttings out of the borehole due to drilling). Each cementing fluid in the slurry 215 may have a magnetic permeability, and the magnetic permeability of each fluid may be modified by adding ferromagnetic material of a prespecified concentration.

Figure 3:
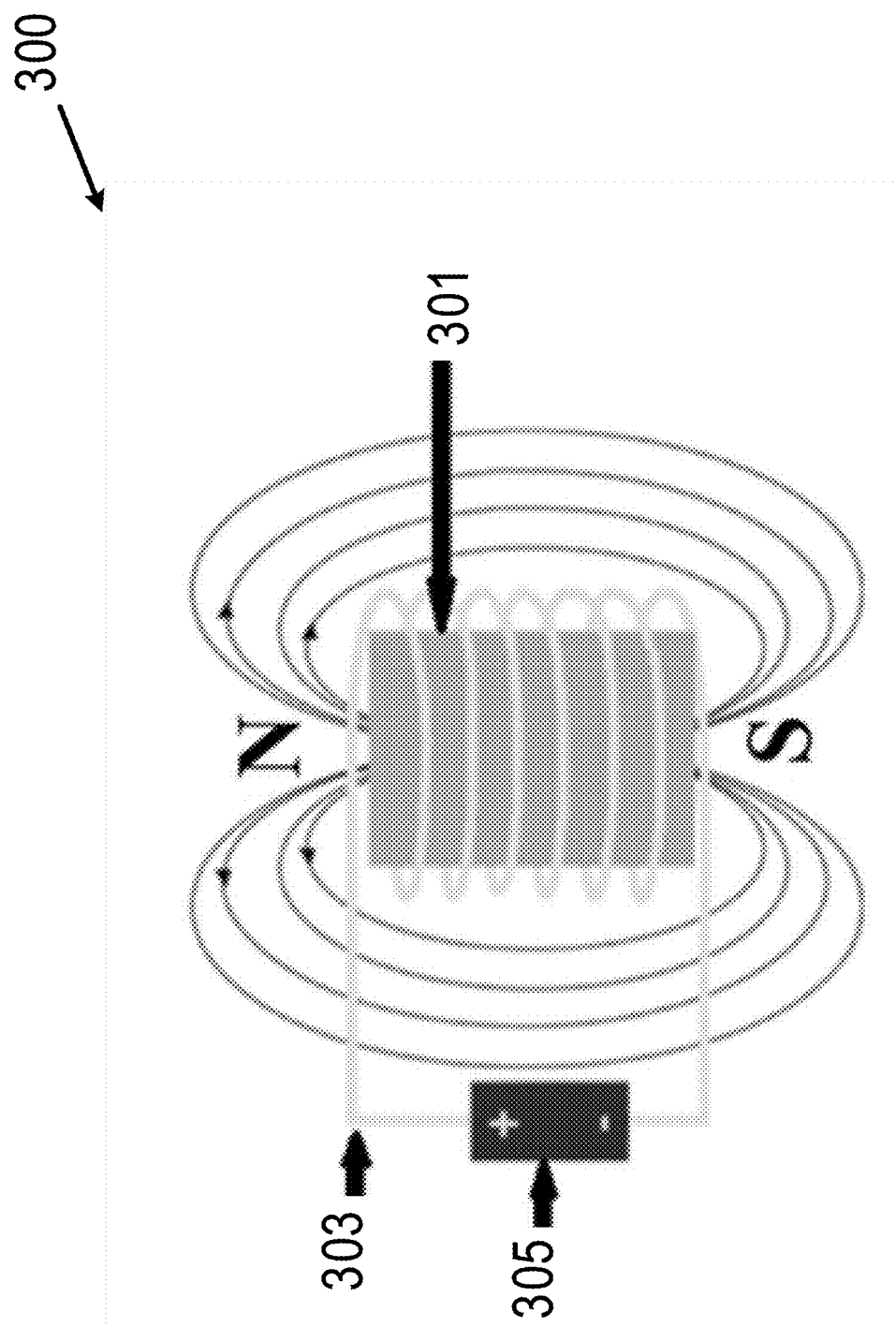
FIG. 3 depicts a schematic diagram of an exemplary permanent electromagnet, according to some embodiments.

FIG. 3 depicts a permanent electromagnet, according to some embodiments. A permanent electromagnet 300 may comprise a permanent magnet core 301 which may generate a permanent magnetic field. In some embodiments, the permanent magnet core 301 may be similar to a magnet within the permanent electromagnet 207. A coil 303 may be wound around the permanent magnet core 301. When supplied with power from a power supply 305, such as a downhole battery, surface power connection, or similar equipment, the coil 303 may electrify and may neutralize the magnetic field generated by the permanent magnet core 301. In some embodiments, the power supply 305 may be instructed to electrify the coil 303 by the acquisition and measurement system 209. In some embodiments, the power supply 305 may be configured to supply power to the coil 303 for set increments of time, as determined by the acquisition and measurement system 209.

Figure 4:
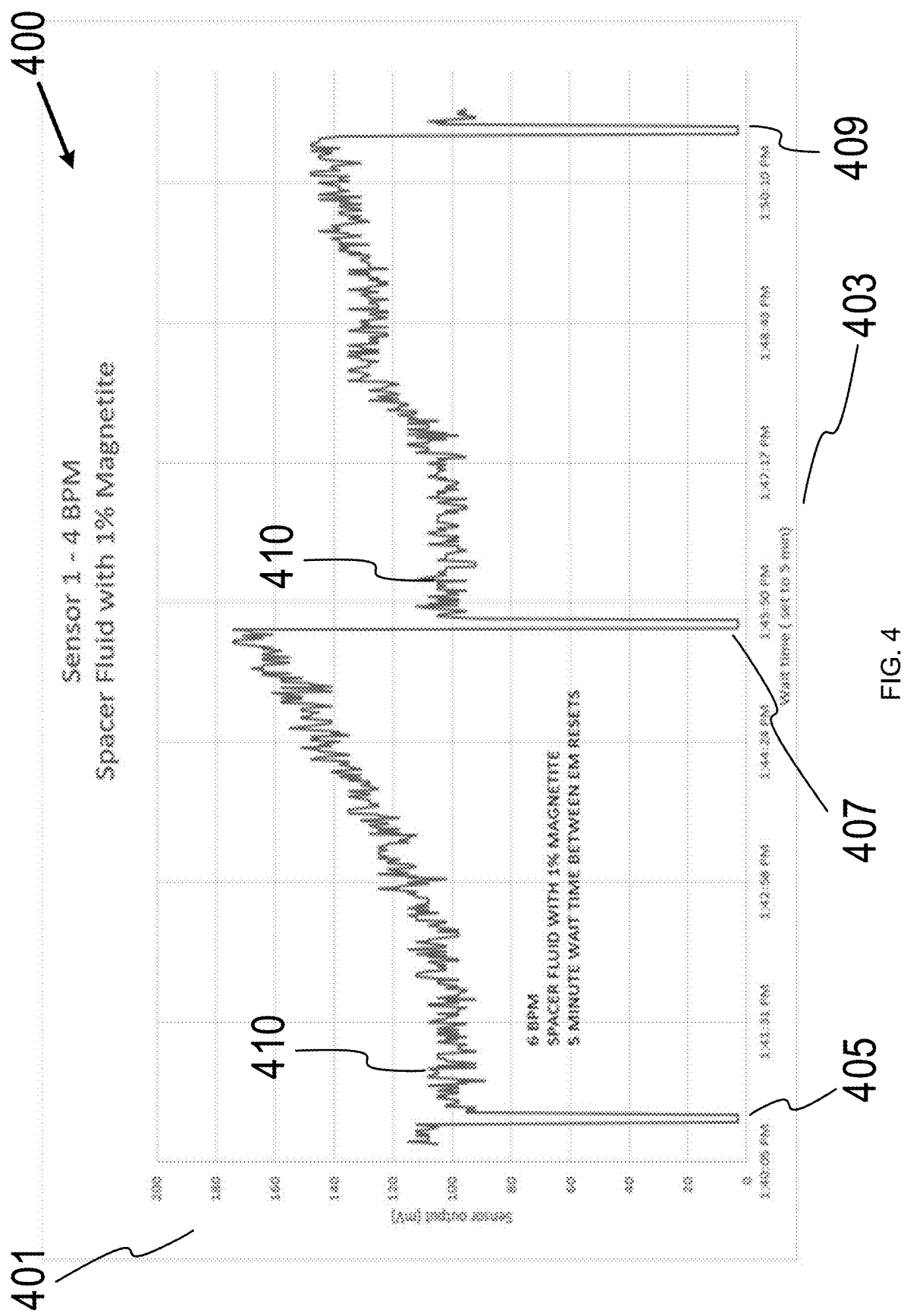
FIG. 4 depicts a plot of a sensor response to 1% Magnetite spacer fluid, according to some embodiments.

FIG. 4 depicts a plot of a sensor response to 1% Magnetite spacer fluid, according to some embodiments. A plot 400 depicts a relationship between a sensor output 401 in millivolts (mV) over a wait time 403. The spacer fluid may be one of the cementing fluids previously discussed. The spacer fluid may comprise 1% Magnetite particulates, and the spacer fluid (similar to the slurry 215 of FIG. 2) may flow at a rate of 4 barrels per minute (bpm). Sensor output may increase over time due to magnetic debris accumulating on the sensor, such as the Hall effect sensor assembly 205. This upward trend in sensor output may be halted and corrected if the magnetic debris is removed from the sensor. At electromagnet resets ("EM reset") 405, 407, and 409, sensor output steeply declines and temporarily plateaus as the magnetic field from the electromagnet is neutralized. In some embodiments, the electromagnet may be similar to the permanent electromagnet 207. Each of the EM resets 405-409 may last for a designated period of time (e.g., a waiting time of 5 seconds), depicted as a sensor output of <5 mV. During each EM reset, flow of the spacer fluid at 4 bpm may wash away accumulated magnetic debris while the magnetic field is neutralized. After each EM reset, the sensor output may return to a baseline measurement 410 (approx. 100 mV), which may be consistent with expected measurements from a clean sensor. The acquisition and measurement system 209 may be configured to implement a buildup cycle of 5-minute intervals between EM resets, where each buildup cycle refers to the time interval where the magnetic field is active and sensor output builds due to magnetic particle accumulation.

Figure 5:
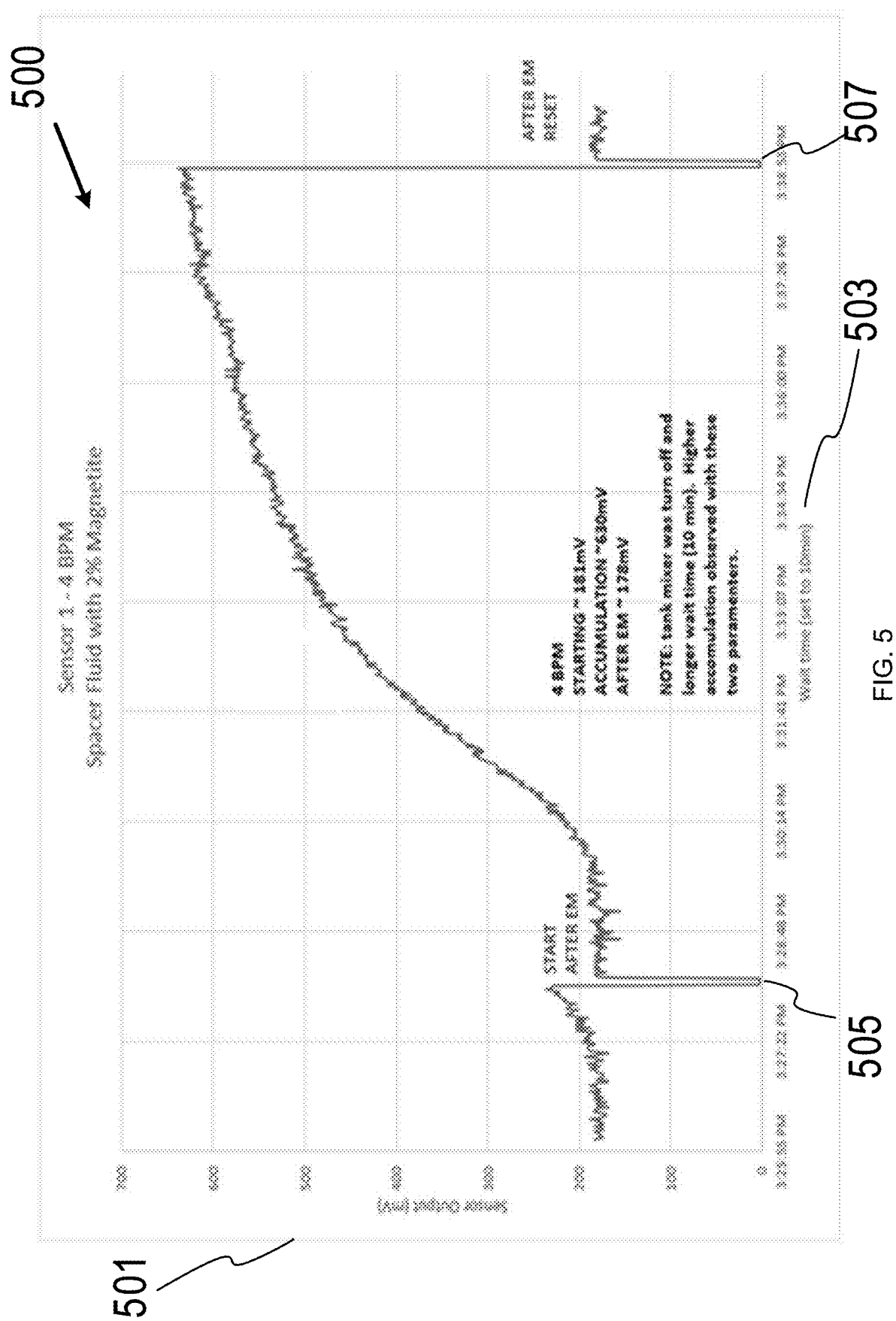
FIG. 5 depicts a plot of a sensor response to 2% Magnetite spacer fluid, according to some embodiments.

FIG. 5 depicts a plot of a sensor response to 2% Magnetite spacer fluid, according to some embodiments. A plot 500, similar to plot 400 of FIG. 4, depicts a relationship between a sensor output 501 (in mV) and a wait time 503. In some embodiments, the sensor may be similar to the Hall effect sensor assembly 205 and may detect the Hall effect of magnetic particles within 2% Magnetite spacer fluid. Similar to the plot 400 of FIG. 4, the sensor output 501 may increase over time until the magnetic field of the permanent electromagnet is neutralized at EM resets 505 and 507. In some embodiments, the buildup cycle between the EM resets 505 and 507 may be affected by parameters of the spacer fluid or by the cementing operation itself. For example, the sensor output 501 may climb extensively (compared to the plot 400 of FIG. 4) due to the higher concentration of magnetite in the spacer fluid, a longer buildup cycle between EM resets, and various operational constraints (e.g., an offline tank mixer) which may increase a rate of particle accumulation on the Hall effect sensor of the Hall effect sensor assembly 205. Prior to EM reset 507, magnetite accumulation on the sensor nearly triples from a baseline measurement to −600 mV. After each EM reset 505 and 507, the sensor may return to the baseline measurement of −180 mV. In some embodiments, the acquisition and measurement system 209 may be configured to alter the buildup cycle between EM resets. In some embodiments, the buildup cycle between EM resets 505 and 507 may be configured to last an interval of 10 minutes, although this may be altered to suit various conditions. During each EM reset 505 and 507, the spacer fluid may wash away accumulated magnetic debris on the sensor and return the sensor output to the baseline once voltage to the permanent electromagnet has ceased. Multiple buildup cycles and EM resets may be performed until the reverse cementing operation is complete.

Figure 6:
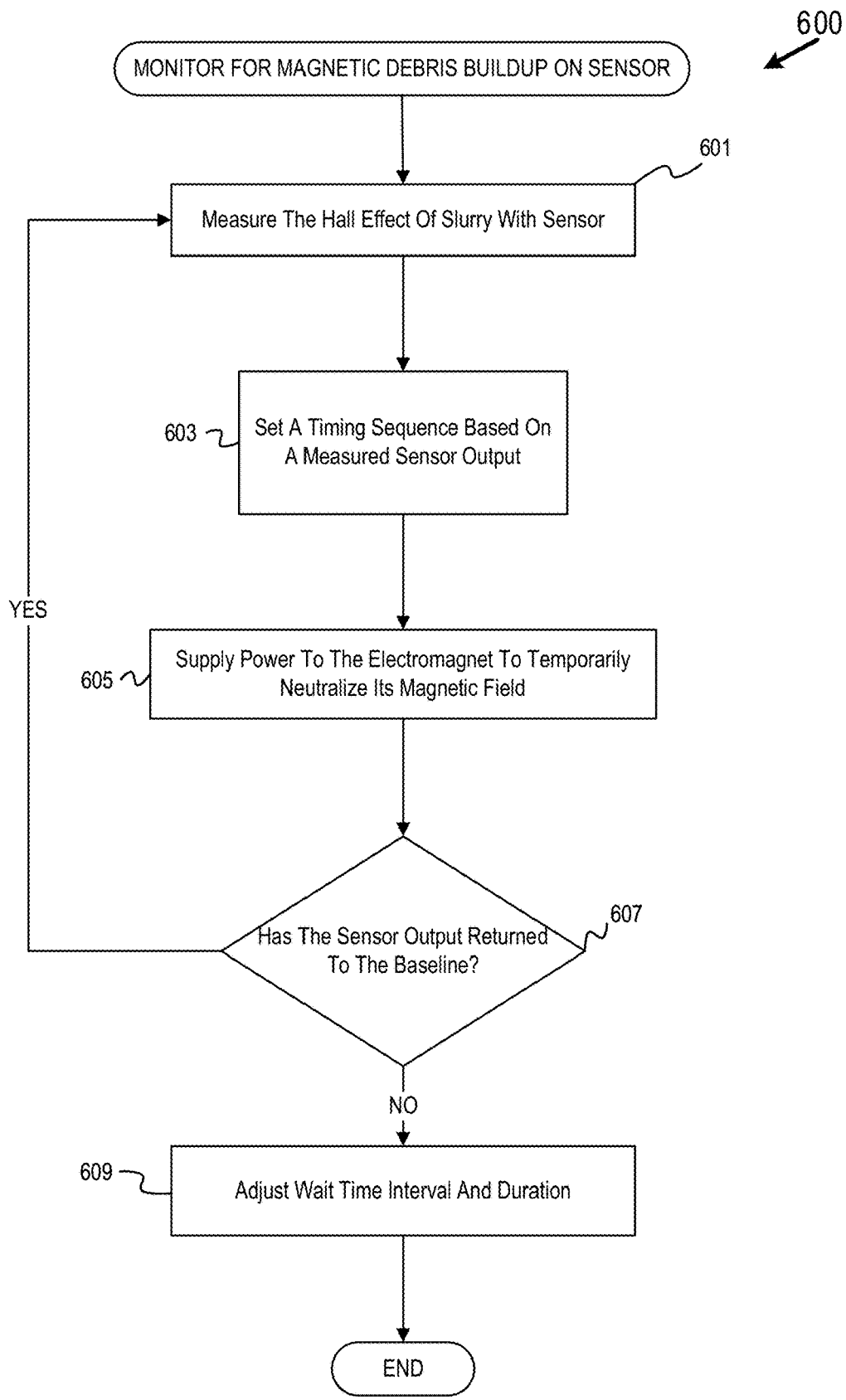
FIG. 6 depicts a flowchart of example operation for monitoring magnetic debris buildup on a sensor, according to some embodiments.

FIG. 6 is a flowchart of example operation for monitoring magnetic debris buildup on a sensor, according to some embodiments. The operations in FIG. 6 are described with reference to a sensor and a processor. These names are for reading convenience and the operations in FIG. 6 may be performed by any component with the functionality described below. Operations of a flowchart 600 begin at block 601.

At block 601, a Hall effect sensor assembly 205 may measure the Hall effect of magnetic particles within the slurry 215. In some embodiments, the magnetic particles may comprise magnetite or hematite mixed with cementing fluids, such as a spacer fluid, and sent down the annulus 203 as the slurry 215. Flow progresses to block 603.

At block 603, a timing sequence may be set based on a measured sensor output. In FIG. 4, the sensor output climbs from a baseline measurement 410 to a peak nearing 180 mV. A sensor output far above the baseline may indicate magnetic particle accumulation on the sensor. The timing sequence may be configured within the acquisition and measurement system 209 to activate the permanent electromagnet 207 at set time intervals. For example, in FIG. 4, EM resets may be configured to occur at 5-minute intervals and may be instructed to last for a waiting time (duration) of 5 seconds each. In FIG. 5, EM resets 505 and 507 occur during a buildup cycle 10 minutes apart and similarly last for 5 seconds each. In some embodiments, both the waiting time of each EM reset and the time between EM resets (buildup cycle) may be configured depending on constraints of the power supply and how often the Hall effect sensor assembly 205 may require cleaning. Flow progresses to block 605.

At block 605, power may be supplied to the permanent electromagnet to temporarily neutralize its magnetic field. The acquisition and measurement system 209 may instruct the power supply 305 to apply a voltage to the coil 303. The electrified coil may temporarily change a polarity of the permanent magnet core 301 which may neutralize its magnetic field. With reference to FIG. 2, magnetic debris accumulated on the Hall effect sensor assembly 205 may be washed away by the slurry 215 while the magnetic field is neutralized. The flow of the slurry 215 alone may not be sufficient to completely clean the Hall effect sensor of debris if the magnetic field is active. Therefore, in some instances, a combination of the discussed electromagnet's magnetic field modulation and fluid flow of the slurry may facilitate sufficient cleaning of the Hall effect sensor assembly 205. After a waiting time (during which the Hall effect sensor assembly 205 is cleaned by the slurry 215) has expired, voltage supply to the coil 303 may cease, and the magnetic field of the permanent magnet core 301 may return to its prior strength.

In some embodiments, the acquisition and measurement system 209 and power supply 305 may be configured to change the polarity of the permanent magnet core 301 to double its strength. For example, in scenarios where the slurry 215 has a decreased concentration of magnetic material, the permanent electromagnet 300 may be configured to double its magnetic field which may enable more accurate readings by the Hall effect sensor assembly 205. Flow progresses to block 607.

At block 607, a decision is made depending on whether the sensor output has returned to its baseline. For example, after each of the EM resets 405-409 and 505-507, the sensor output returns to a baseline measurement of sensor output. In FIG. 4 after EM reset 407, the sensor output may return to the baseline measurement 410 around 100 mV, indicating that sensor cleaning during the EM reset was successful. If the sensor output returns to its baseline, flow returns to block 601, where the Hall effect sensor assembly 205 may continue measuring the Hall effect of magnetic particles within the slurry 215. This cycle may repeat a plurality of times until the reverse cementing operation has concluded. If the sensor output does not return to its baseline, flow progresses to block 609 where corrective action may be taken.

At block 609, a wait time interval and duration may be adjusted. The wait time interval may refer to the buildup cycle described in FIGS. 4-5. The wait time duration may describe the duration of each EM reset. For example, if the sensor output of block 607 did not return to its baseline output, the duration of the EM reset may have been insufficient. The slurry 215 may not have cleared all or most of the magnetic debris accumulated on the Hall effect sensor assembly 205 and may require a longer EM reset duration to do so. In some embodiments, the slurry 215 may comprise increased concentrations of magnetic particles. At increased concentrations, magnetic particles may deposit on the Hall effect sensor at an increased rate, and the wait time interval (buildup cycle) may be shortened to accommodate. Both the wait time interval and wait time duration, collectively referred to as time parameters, may be adjusted through the acquisition and measurement system 209 between cementing operations.

Figure 7:
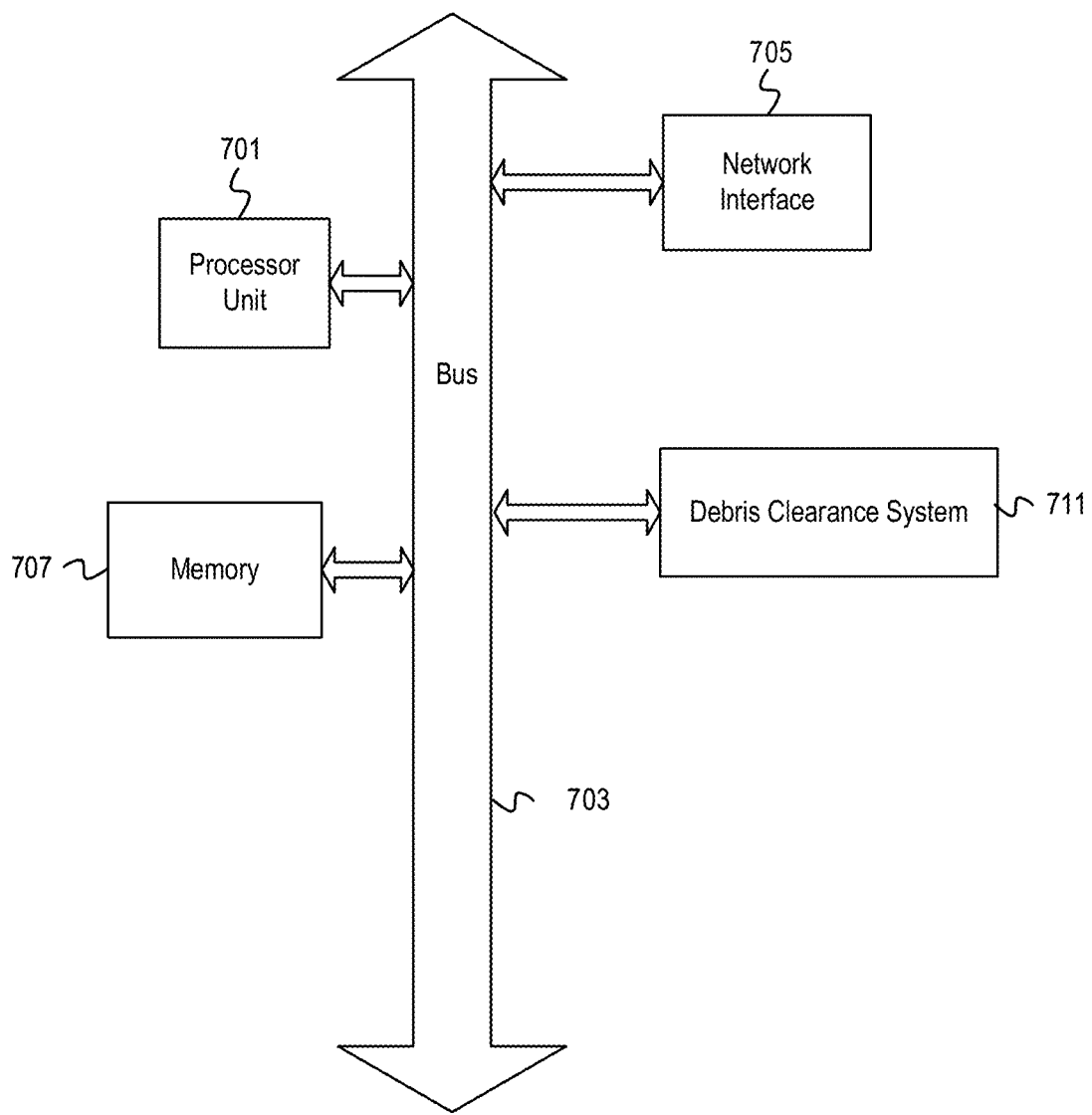
FIG. 7 depicts an example computer, according to some embodiments.

FIG. 7 depicts an example computer system, according to some embodiments. The computer system may include a processor 701 (possibly including multiple processors, multiple cores, multiple nodes, and/or implementing multithreading, etc.). The computer system may include memory 707. The memory 707 may be system memory or any one or more of the above already described possible realizations of machine-readable media. The computer system may also include a bus 703 and a network interface 705. The system may communicate via transmissions to and/or from remote devices via the network interface 705 in accordance with a network protocol corresponding to the type of network interface, whether wired or wireless and depending upon the carrying medium. In addition, a communication or transmission may involve other layers of a communication protocol and or communication protocol suites (e.g., transmission control protocol, Internet Protocol, user datagram protocol, virtual private network protocols, etc.). The system also includes a debris clearance system 711. The debris clearance system 711 may adjust timing parameters such as the timing sequence between EM resets of the downhole sensor (i.e., when the permanent electromagnet is neutralized and fluid flow washes away accumulated debris) or the duration of each EM reset (as described herein). The debris clearance system 711 may additionally be configured to apply voltage from a power source to the permanent electromagnet (as described herein). Any one of the previously described functionalities may be partially (or entirely) implemented in hardware and/or on the processor 701. For example, the functionality may be implemented with an application specific integrated circuit, in logic implemented in the processor 701, in a co-processor on a peripheral device or card, etc. Further, realizations may include fewer or additional components not illustrated in FIG. 7 (e.g., video cards, audio cards, additional network interfaces, peripheral devices, etc.). The processor 701 and the network interface 705 are coupled to the bus 703. Although illustrated as being coupled to the bus 703, the memory 707 may be coupled to the processor 701.

While the aspects of the disclosure are described with reference to various implementations and exploitations, it will be understood that these aspects are illustrative and that the scope of the claims is not limited to them. In general, techniques for measuring the Hall effect of a slurry via a sensor and techniques for cleaning the sensor of accumulated magnetic debris as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" may be infringed with only one of the listed items, multiple of the listed items, and one or more of the items in the list and another item not listed.

EXAMPLE EMBODIMENTS

Embodiment 1

A method for reducing magnetic debris accumulation on a downhole sensor within a tubular conveyed in a borehole, comprising: supplying a voltage to temporarily neutralize a magnetic field of a permanent electromagnet proximate to the downhole sensor; and removing magnetic debris on the downhole sensor via a flow of a first fluid in the tubular while the magnetic field is neutralized.

Embodiment 2

The method of Embodiment 1, further comprising: ceasing the supply of voltage to the permanent electromagnet after a waiting time has passed; and analyzing a sensor output of the downhole sensor, wherein the sensor output indicates an extent of the magnetic debris removal.

Embodiment 3

The method of any one of Embodiments 1-2, wherein the first fluid comprises a slurry, and wherein the slurry comprises magnetic particles detectable by the downhole sensor.

Embodiment 4

The method of any one of Embodiments 2-3, wherein the downhole sensor is a Hall effect sensor configured for use in a reverse cementing operation, and wherein the supplying and ceasing of the voltage to the permanent electromagnet occurs a plurality of times during the operation.

Embodiment 5

The method of Embodiment 4, wherein a timing sequence dictating a length of time between instances of supplying power to the permanent electromagnet may be adjusted based on the extent of the magnetic debris removal.

Embodiment 6

The method of any one of Embodiments 2-5, wherein the waiting time indicates a duration of voltage supply to the permanent electromagnet, and wherein the waiting time is adjusted based, at least in part, on the extent of magnetic debris removal.

Embodiment 7

The method of any one of Embodiments 1-6, wherein supplying the voltage changes a polarity of the permanent electromagnet.

Embodiment 8

An apparatus configured to reduce magnetic debris accumulation on a downhole sensor within a tubular conveyed in a borehole, the apparatus comprising: the downhole sensor; a permanent electromagnet coupled with a power source and proximate to the downhole sensor; and a processor coupled with the downhole sensor and the permanent electromagnet, the processor comprising instructions to: supply a voltage to temporarily neutralize a magnetic field of the permanent electromagnet while a first fluid removes at least some of the magnetic debris from the downhole sensor.

Embodiment 9

The apparatus of Embodiment 8 further including instructions to cease the supply of voltage to the permanent electromagnet after a waiting time has passed.

Embodiment 10

The apparatus of any one of Embodiments 8-9, wherein the voltage changes a polarity of the permanent electromagnet.

Embodiment 11

The apparatus of any one of Embodiments 8-10, where the downhole sensor comprises a Hall effect sensor.

Embodiment 12

The apparatus of any one of Embodiments 8-11, wherein the power source comprises a battery coupled to a coil, wherein the coil wraps around a core of the permanent electromagnet.

Embodiment 13

The apparatus of any one of Embodiments 9-12, wherein the processor further comprises instructions to: analyze a sensor output of the downhole sensor, wherein the sensor output indicates an extent of magnetic debris removal; and adjust time parameters based, at least in part, on the extent of the magnetic debris removal.

Embodiment 14

The apparatus of Embodiment 13, wherein the instructions to adjust the time parameters comprise instructions to adjust the waiting time and instructions to adjust a timing sequence between periods of ceasing voltage to the permanent electromagnet.

Embodiment 15

A system configured to reduce magnetic debris accumulation on a downhole sensor within a tubular conveyed in a borehole, the system comprising: the tubular conveyed in the borehole; the downhole sensor; a permanent electromagnet coupled with a power source and proximate to the downhole sensor; and a processor coupled with the downhole sensor and the permanent electromagnet, the processor comprising instructions to: supply a voltage to temporarily neutralize a magnetic field of the permanent electromagnet while a first fluid removes at least some of the magnetic debris from the downhole sensor.

Embodiment 16

The system of Embodiment 15 further including instructions to cease the supply of voltage to the permanent electromagnet after a waiting time has passed.

Embodiment 17

The system of any one of Embodiments 15-16, where the downhole sensor comprises a Hall effect sensor.

Embodiment 18

The system of any one of Embodiments 15-17, wherein the power source comprises a battery coupled to a coil, wherein the coil wraps around a core of the permanent electromagnet.

Embodiment 19

The system of any one of Embodiments 16-18, wherein the processor further comprises instructions to: analyze a sensor output of the downhole sensor, wherein the sensor output indicates an extent of magnetic debris removal; and adjust time parameters based, at least in part, on the extent of the magnetic debris removal.

Embodiment 20

The system of Embodiment 19, wherein the instructions to adjust the time parameters comprise instructions to adjust the waiting time and instructions to adjust a timing sequence between periods of ceasing voltage to the permanent electromagnet.

What is claimed is:

1. A method for reducing magnetic debris accumulation on a downhole sensor within a tubular conveyed in a borehole, comprising:
   determining a timing sequence to temporarily neutralize a magnetic field of a permanent electromagnet proximate to the downhole sensor based, at least in part, on a measured output of the downhole sensor;
   supplying, according to the timing sequence, a voltage to temporarily neutralize the magnetic field of the permanent electromagnet; and
   removing magnetic debris on the downhole sensor via a flow of a first fluid in the tubular while the magnetic field is neutralized.

2. The method of claim 1, further comprising:
   ceasing the supply of voltage to the permanent electromagnet after a waiting time has passed; and
   analyzing a sensor output of the downhole sensor, wherein the sensor output indicates an extent of the magnetic debris removal.

3. The method of claim 2, wherein the downhole sensor is a Hall effect sensor configured for use in a reverse cementing operation, and wherein the supplying and ceasing of the voltage to the permanent electromagnet occurs a plurality of times during the operation.

4. The method of claim 3, wherein the timing sequence dictates a length of time between instances of supplying power to the permanent electromagnet, and wherein the timing sequence may be adjusted based on the extent of the magnetic debris removal.

5. The method of claim 2, wherein the waiting time indicates a duration of voltage supply to the permanent electromagnet, and wherein the waiting time is adjusted based, at least in part, on the extent of magnetic debris removal.

6. The method of claim 1, wherein the first fluid comprises a slurry, and wherein the slurry comprises magnetic particles detectable by the downhole sensor.

7. The method of claim 1, wherein supplying the voltage changes a polarity of the permanent electromagnet.

8. An apparatus configured to reduce magnetic debris accumulation on a downhole sensor within a tubular conveyed in a borehole, the apparatus comprising:
the downhole sensor;
a permanent electromagnet coupled with a power source and proximate to the downhole sensor; and
a processor coupled with the downhole sensor and the permanent electromagnet, the processor comprising instructions to:
determine a timing sequence to temporarily neutralize a magnetic field of the permanent electromagnet based, at least in part, on a measured output of the downhole sensor; and
supply, according to the timing sequence, a voltage to temporarily neutralize the magnetic field of the permanent electromagnet while a first fluid removes at least some of the magnetic debris from the downhole sensor.

9. The apparatus of claim 8 further including instructions to cease the supply of voltage to the permanent electromagnet after a waiting time has passed.

10. The apparatus of claim 9, wherein the processor further comprises instructions to:
analyze the sensor output of the downhole sensor, wherein the sensor output indicates an extent of magnetic debris removal; and
adjust one or more time parameters based, at least in part, on the extent of the magnetic debris removal.

11. The apparatus of claim 10, wherein the instructions to adjust the one or more time parameters comprise instructions to adjust the waiting time and instructions to adjust the timing sequence between periods of ceasing voltage to the permanent electromagnet.

12. The apparatus of claim 8, wherein the voltage changes a polarity of the permanent electromagnet.

13. The apparatus of claim 8, where the downhole sensor comprises a Hall effect sensor.

14. The apparatus of claim 8, wherein the power source comprises a battery coupled to a coil, wherein the coil wraps around a core of the permanent electromagnet.

15. A system configured to reduce magnetic debris accumulation on a downhole sensor within a tubular conveyed in a borehole, the system comprising:
the tubular conveyed in the borehole;
the downhole sensor;
a permanent electromagnet coupled with a power source and proximate to the downhole sensor; and
a processor coupled with the downhole sensor and the permanent electromagnet, the processor comprising instructions to:
determine a timing sequence to temporarily neutralize a magnetic field of the permanent electromagnet based, at least in part, on a measured output of the downhole sensor; and
supply, according to the timing sequence, a voltage to temporarily neutralize the magnetic field of the permanent electromagnet while a first fluid removes at least some of the magnetic debris from the downhole sensor.

16. The system of claim 15 further including instructions to cease the supply of voltage to the permanent electromagnet after a waiting time has passed.

17. The system of claim 16, wherein the processor further comprises instructions to:
analyze the sensor output of the downhole sensor, wherein the sensor output indicates an extent of magnetic debris removal; and
adjust one or more time parameters based, at least in part, on the extent of the magnetic debris removal.

18. The system of claim 17, wherein the instructions to adjust the one or more time parameters comprise instructions to adjust the waiting time and instructions to adjust the timing sequence between periods of ceasing voltage to the permanent electromagnet.

19. The system of claim 15, where the downhole sensor comprises a Hall effect sensor.

20. The system of claim 15, wherein the power source comprises a battery coupled to a coil, wherein the coil wraps around a core of the permanent electromagnet.

* * * * *